United States Patent [19]
Poppe et al.

[11] Patent Number: 5,164,609
[45] Date of Patent: Nov. 17, 1992

[54] CONTROLLABLE POWER DISTRIBUTION SYSTEM

[75] Inventors: Robert P. Poppe, Grand Rapids; Nicholas W. Medendorp; David W. Caldwell, both of Holland, all of Mich.

[73] Assignees: Donnelly Corporation, Holland; Steelcase, Inc., Grand Rapids, both of Mich.

[21] Appl. No.: 535,103

[22] Filed: Jun. 8, 1990

[51] Int. Cl.$^5$ .............................................. H01B 7/30
[52] U.S. Cl. ...................................... 307/147; 307/38; 307/116
[58] Field of Search ............... 361/168.1, 169.1, 173, 361/175, 176, 177, 190, 205, 152–160; 307/143, 140, 38, 39, 40, 113–117; 379/340, 310, 103, 104, 91, 92, 93, 94, 95, 96, 97, 98

[56] References Cited

U.S. PATENT DOCUMENTS

| | | | |
|---|---|---|---|
| 2,782,308 | 2/1957 | Rug | 250/36 |
| 3,040,178 | 6/1962 | Lyman et al. | 250/213 |
| 3,200,304 | 8/1965 | Atkins et al. | 317/146 |
| 3,200,305 | 8/1965 | Atkins | 317/146 |
| 3,200,306 | 8/1965 | Atkins et al. | 317/146 |
| 3,254,313 | 5/1966 | Atkins et al. | 331/141 |
| 3,275,897 | 9/1966 | Atkins | 317/146 |
| 4,101,886 | 7/1978 | Grimes et al. | 164/14 |
| 4,174,517 | 11/1979 | Mandel | 340/310 |
| 4,223,301 | 9/1980 | Grimes et al. | 340/500 |
| 4,237,386 | 12/1980 | Isntance | 307/116 |
| 4,246,533 | 1/1981 | Chiang | 323/349 |
| 4,352,992 | 10/1982 | Buennagel et al. | 307/40 |
| 4,380,040 | 4/1983 | Posset | 361/280 |
| 4,493,377 | 1/1985 | Gunther et al. | 173/170 |
| 4,529,968 | 7/1985 | Hilsum et al. | 340/365 |
| 4,535,254 | 8/1985 | Khatri | 307/38 |
| 4,550,310 | 10/1985 | Yamaguchi et al. | 340/365 |
| 4,584,519 | 4/1986 | Groudis | 323/245 |
| 4,731,549 | 3/1988 | Hiddleson | 307/125 |
| 4,740,781 | 4/1988 | Brown | 340/712 |
| 5,003,578 | 3/1991 | Lin | 379/90 |

OTHER PUBLICATIONS

U. S. patent application Ser. No. 07/535,111, filed Jun. 8, 1990, by David Caldwell et al. entitled Touch-Sensitive Control Circuit.

U. S. patent application Ser. No. 07/535,104 by Nicholas W. Medendorp filed Jun. 8, 1990, for a Modular Power Outlet Strip.

*Primary Examiner*—A. D. Pellinen
*Assistant Examiner*—Aditya Krishnan
*Attorney, Agent, or Firm*—Price, Heneveld, Cooper, DeWitt & Litton

[57] ABSTRACT

A user operable power distribution system that is suitable for supplying switched power to an individual workstation, or to an entire office, is expandable to accommodate additional loads. The system includes a user command device, such as a touch panel, for supplying low voltage command signals and a connection device, which responds to the low voltage command signal to interconnect a load with a supply voltage, such as an AC power outlet. The connection device further responds to the low voltage input command signal by producing a low voltage output command signal which may be applied to another connection device to cause that particular connection device to connect another load with a source of supply voltage. In this manner, the connection devices may be ganged in an indefinite number.

22 Claims, 9 Drawing Sheets

CONTROLLABLE POWER DISTRIBUTION SYSTEM

BACKGROUND OF THE INVENTION

This invention relates to the distribution of electrical power to various load devices. More particularly, the invention concerns the distribution of building power to power receptacles, lighting devices and to other electrical equipment and appliances. The invention is especially adapted for supplying the electrical needs of office work stations.

It has been recognized that portable office partitions could be made more functional if the electrical power distribution to power receptacles and to lighting devices could be built into the panels and readily interconnected between adjacent panels. Such an approach is provided in U.S. Pat. No. 4,203,639, issued to Harold VanderHoek et al for a PANEL WIRING SYSTEM. However, such power distribution system must be designed into the structure of the partitions and is not readily adaptable to existing non-electrified partitions.

Another desirable feature of a power distribution system is the ability to control the application of electrical power to the load. Traditional load switching techniques are not only cumbersome and inflexible but are not compatible with the multitude of sophisticated control devices presently available. While control schemes have been suggested to provide control of multiple loads within, for example, a common office suite, such schemes have significant drawbacks. One such scheme encodes control information onto the high voltage power supply circuit, including the address of the intended "smart receptacle." The information is decoded at the load control device by logic circuitry in order to energize or deenergize the load. Another scheme utilizes radio transmission signals to send control information, including device addresses, to load control devices located throughout an office suite. Such schemes are not only overly complex and expensive, they have proven to be susceptible to radio frequency interference from various sources and have a limited number of addresses available. Furthermore, while it may be intended to limit the scope of control to a particular office or suite, there is no known practical approach to precluding interference with adjacent office suites and even adjacent buildings.

SUMMARY OF THE INVENTION

The present invention provides a power distribution system that is suitable for supplying switched power to an individual work station or to an entire office. The present invention additionally accommodates a multiplicity of different input control devices and is adaptable to the control of various types of loads. The invention further provides exceptional resistance to interference from external sources and provides secure control within a defined area.

The invention is embodied in a power distribution system having a connection device, including a switch circuit for selectively connecting a load with a source of supply voltage. The connection device includes a low voltage input and a low voltage output. The switch circuit is responsive to a low voltage command signal on the low voltage input to connect the load with the source of supply voltage. The low voltage output is also responsive to a low voltage command signal on the low voltage input to provide a low voltage command signal that may be used as a low voltage command signal for another connection device. In this manner, the connection devices may be ganged.

These and other objects, advantages and features of this invention will become apparent upon review of the following specification in conjunction with the drawings.

DESCRIPTION OF THE PREFERRED EMBODIMENT

Figure 1:
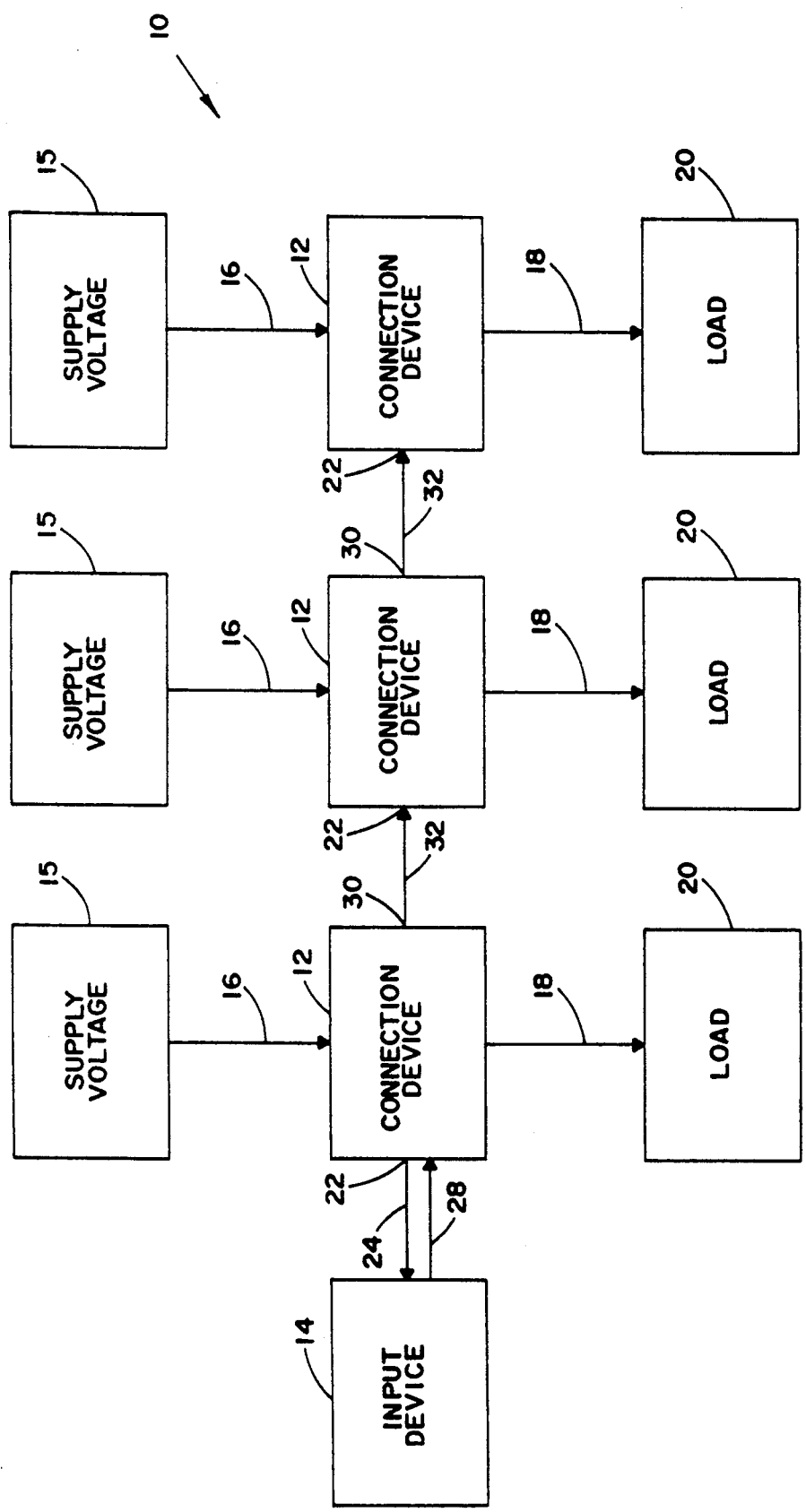
FIG. 1 is a block diagram of a power distribution system embodying the present invention.

Referring now specifically to the drawings, and the illustrative embodiments depicted therein, a power distribution system 10 includes one or more connection devices 12 and an input device 14 for supplying command signals to the connection device 12 that is connected thereto (FIG. 1). Each connection device 12 includes a connection 16 with a source of supply voltage 15. In the illustrated embodiment, the supply voltage is 120 volt, 60 Hz high voltage building power, although other sources of supply voltage may be used. For example, supply voltage 15 could be low voltage AC or direct current voltage. Each connection device 12 additionally includes a connection 18 for supplying high voltage power to a load 20. In the illustrated embodiment, load 20 is a power receptacle for receipt of the power cord from various user appliances, such as computers, small electrical appliances, lighting devices, or the like. However, the invention is not limited to the use with such power receptacles. For example, load 20 could be a lighting device with connection 18 being a hard-wired power cable to the lighting device.

Each connection device 12 includes a low voltage input connection 22 for receipt of a low voltage command signal. The first connection device 12 receives a low voltage command signal at input 22 from a line 28 extending from input device 14. Input device 14 produces a low voltage command signal on line 28 in order to cause the first high voltage device 12 connected to line 28 to connect its load 20 with its power connection 16. Each connection device 12 includes a low voltage output 30 which applies a low voltage command signal on a line 32 extending to the low voltage input 22 of another connection device 12. While line 32 is a hard-wire connection in the illustrated embodiment, an RF or infrared signal could be utilized. Each connection device 12 provides a low voltage command signal at its low voltage output 30 in response to a low voltage command signal being received at its input 22. In this manner, a low voltage command signal produced by input device 14 causes all connection devices 12, connected in this manner, to connect their respective load 20 with its supply voltage 15 connected with connection 16. It may thus be seen that power distribution system 10 may be enlarged by connecting additional connection devices 12 in such ganged fashion as illustrated in FIGS. 1-3 High voltage connection device 12 provides a continuous low voltage power source on a line 24 connected with input device 14 in order to supply power to input device 14.

Figure 2A:
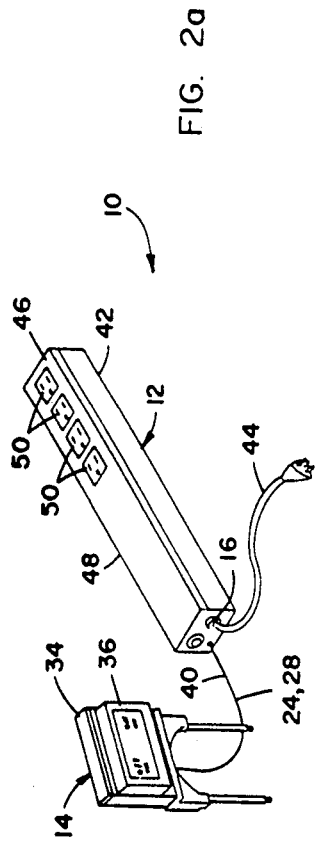
FIGS. 2A-C illustrate several configurations of an embodiment of the invention.
Figure 2B:
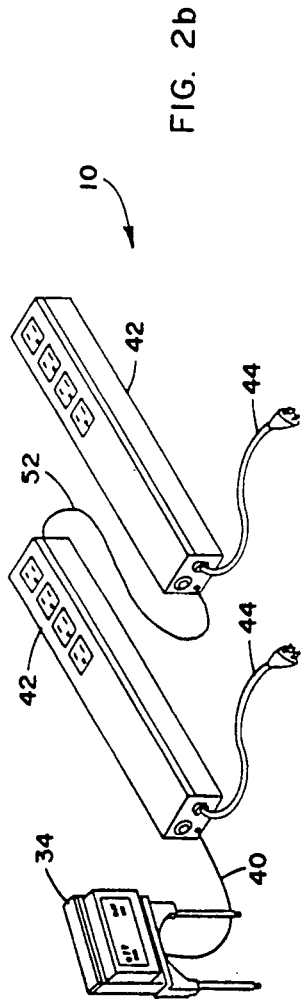
Figure 2C:
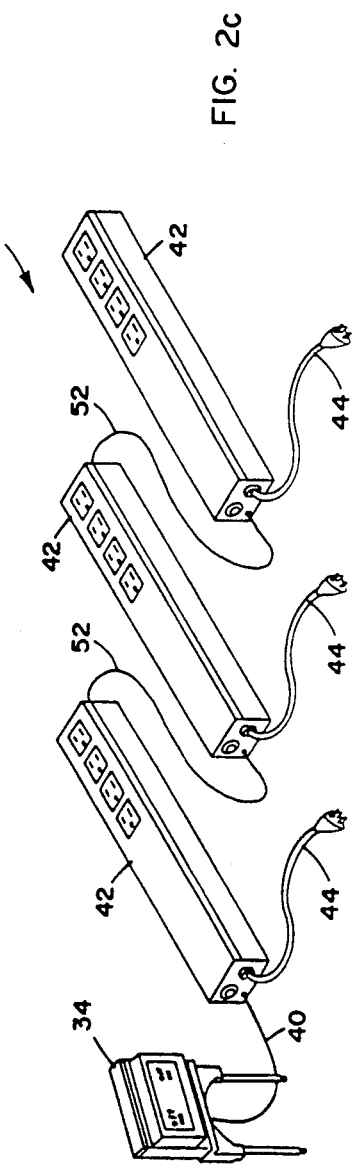
Figure 7A:
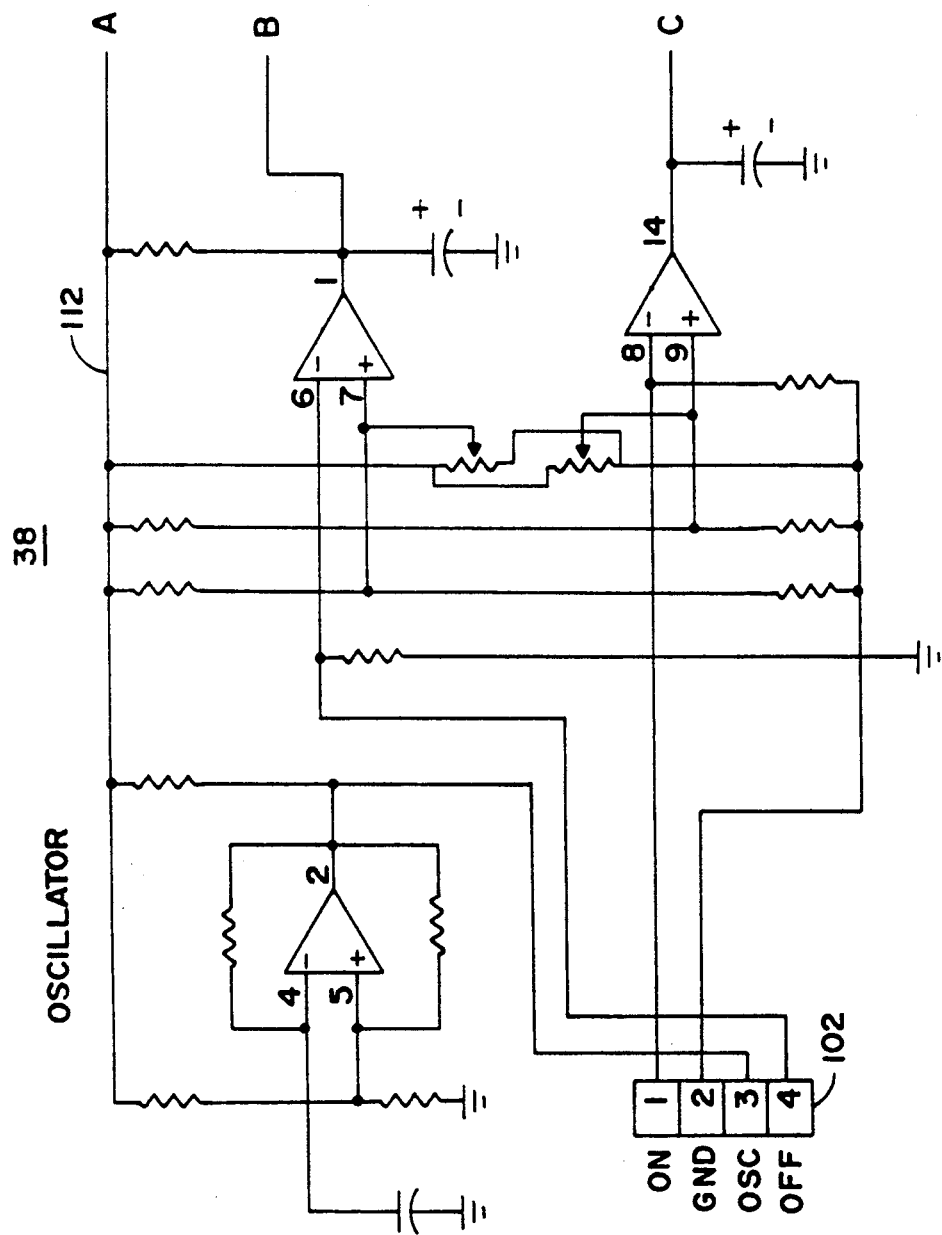
FIG. 7 is a schematic diagram of a circuit for a touch responsive user input device for use with the circuit in FIG. 4.
Figure 7B:
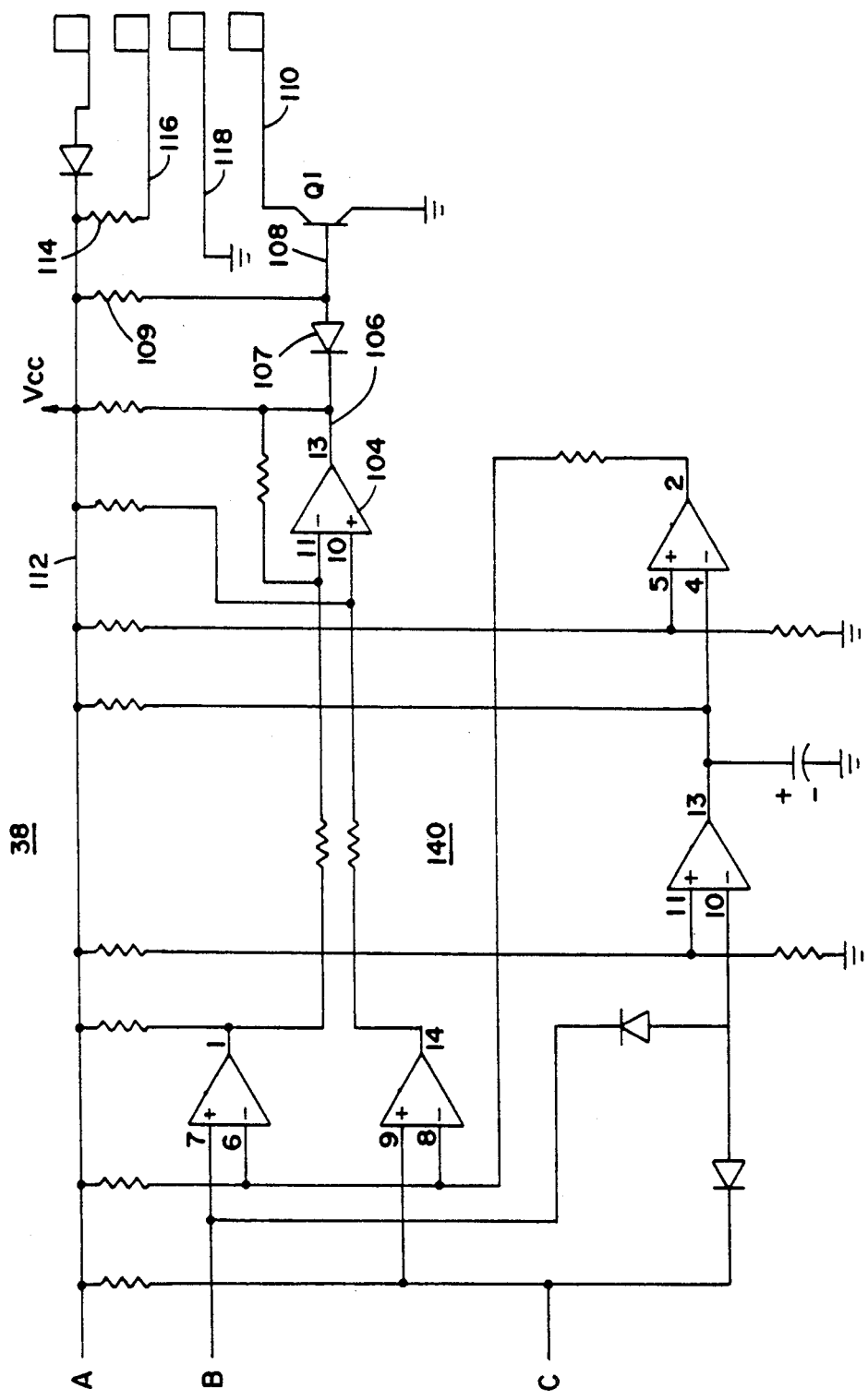
Figure 8:
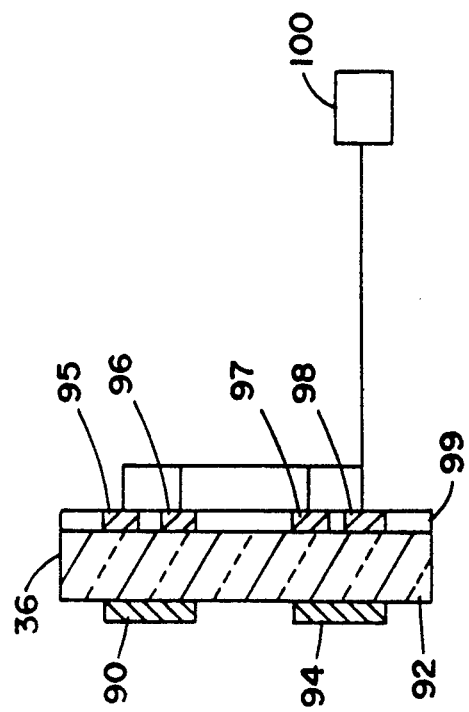
FIG. 8 illustrates a touch switch panel for use with the circuit in FIGS. 7a; and 7b

In FIGS. 2A-2C, input device 14 is illustrated as embodied in a touch control module 34 having a user-contact responsive touch panel 36 and a touch-responsive circuit 38 (FIGS. 7a, 7b and 8). Low voltage lines 24 and 28 are combined in a unitary low voltage cable 40 extending from touch control module 34 to the first connection device 12. In the embodiment illustrated in FIGS. 2A-3, the high voltage connection device is a power strip 42. The connection 16 for power strip 42 is in the form of a conventional power cable 44 for supplying high voltage electrical power from a building power grid, or from a built-in receptacle in an office partition. Power strip 42 includes a case, or housing, 46 having a top surface 48 as well as bottom and side surfaces A plurality of power receptacles 50 are mounted to top surface 48 to provide switchable high voltage power to various electrical loads, which may be controlled from touch control module 34.

Power strip 42 defines a temporary power tap which may be readily installed by a user without the use of tools, while complying with presently applicable electrical codes. Another low voltage cable 52 is illustrated extending from the power strip 42 that is connected directly with touch control module 34, to another power strip 42 (FIG. 2B) and from the second power strip 42 to another power strip 42 (FIG. 2C). This ganged interconnection may be continued in order to connect additional power strips 42 into a power distribution system that is switchable "on" and "off" (energized and deenergized) by a single touch control module 34. As will be set forth in more detail below, features of the disclosed embodiment facilitate the use of a theoretically unlimited number of power strips 42 in a power distribution system 10 controlled by a single touch control module 34. Power cable 44 for each power strip 42 is individually connected with the building's power grid. Accordingly, power cables 44 may be interconnected with the same or different circuits in the power grid in order to avoid the overloading of any one particular circuit as a result of an excessive number of appliances being powered from power strips 42.

Figure 3:
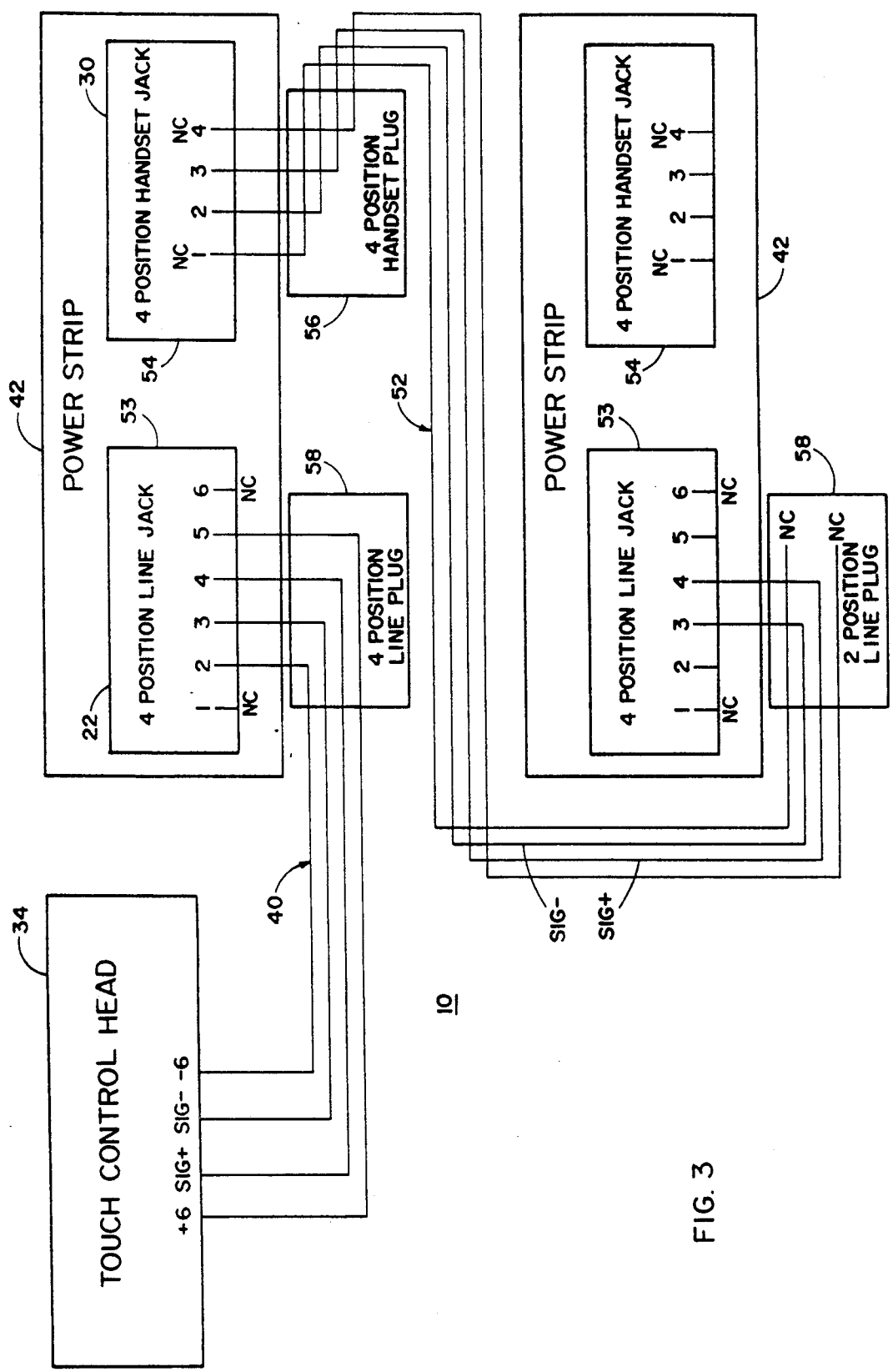
FIG. 3 is a schematic diagram illustrating the interconnection of multiple high voltage connection devices with an input device.

In the illustrated embodiment, low voltage input 22 includes a conventional telephone line jack 53 and low voltage output 30 includes a conventional telephone hand-set jack 54 (FIG. 3). Accordingly, cable 40 includes a conventional telephone line plug 58 at its terminal end. Low voltage cable 52 includes a telephone hand-set plug 56 at one end and a line plug 58 at its opposite end. Because line plug 58 is not compatible with hand-set jack 54 and hand-set plug 56 is not compatible with line jack 53, this configuration reduces the risk that a user will misconnect power distribution system 10. Furthermore, low voltage cables 40 and 52 may be supplied from readily available components which are manufactured by numerous companies. In the illustrated embodiment, line jack 53 is marketed by the Amp Company under Part No. 520242-2, hand-set jack 54 under Part No. 520241-2, hand-set plug 56 under Part No. 5-641335 and line plug 58 under Part No. 5-641334.

Figure 4:
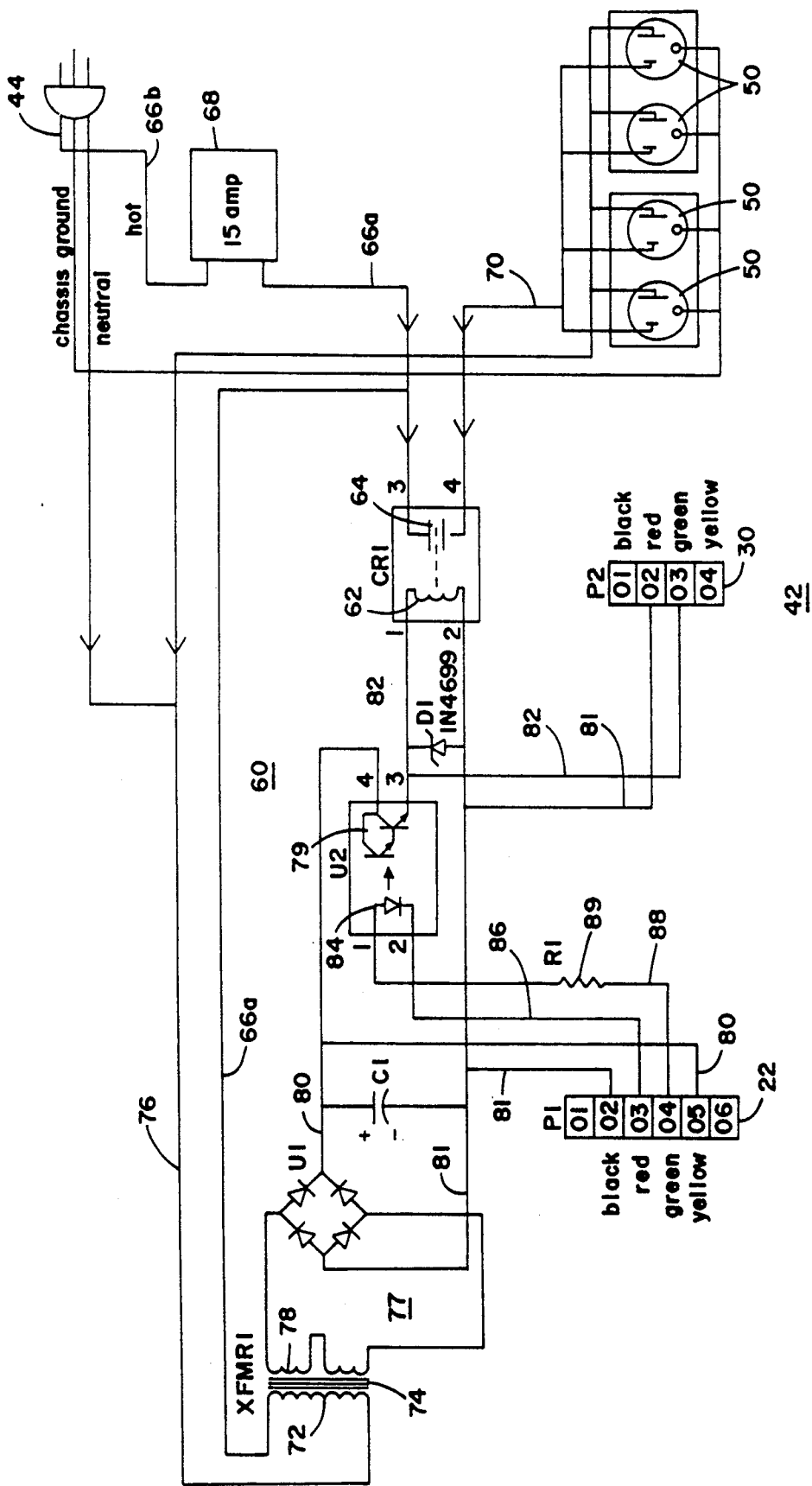
FIG. 4 is a schematic diagram illustrating the circuit for a high voltage connection device.

Each high voltage connection device, such as power strip 42, includes a switching circuit 60 (FIG. 4). Switching circuit 60 includes a relay CR1 having a low voltage coil 62 and a set of high voltage contacts 64. One contact 64 is connected by line 66a, through a circuit breaker 68 and a line 66b, to power cable 44. The other contact 64 is connected through a line 70 to the "hot" terminal of power receptacles 50. Line 66a additionally extends to the primary winding 72 of a transformer 74. Primary winding 72 is additionally connected by a line 76 to the neutral wire of power cable 44 and to the neutral contacts of power receptacles 50. A low voltage winding 78 of transformer 74 is connected with a full wave rectifier U1 to provide an unregulated low voltage power supply 77. Low voltage power supply 77 provides a full wave rectified signal on lines 80 and 81 that is filtered by a filter capacitor C1 across lines 80 and 81. However, in the preferred embodiment, no additional voltage regulation is provided for power supply 77. Voltage regulation not only adds expense but creates thermal management problems.

Line 80 is connected through a Darlington transistor portion of an optical coupler U2 to a line 82 that is connected to low voltage coil 62 of relay CR1. The opposite terminal of coil 62 is connected to line 81. Input diode 84 of optical coupler U2 is connected through a line 86 and a line 88, having a series resistor 89 therein, to low voltage input 22. Unregulated low voltage power supply lines 80 and 81 are additionally supplied to low voltage input connection 22. Lines 82 and 81 extend to low voltage output connection 30.

With power cable 44 connected to a source of high voltage electrical power, relay CR1 is energized to interconnect appliances plugged into power receptacles 50 whenever a DC voltage is supplied across lines 86 and 88 sufficient to cause diode 84 to switch transistor pair 79 into conduction. When transistor pair 79 conducts, a path is established from line 80 through transistor 79 and line 82 to coil 62 in order to apply a positive low voltage signal across coil 62. Simultaneously, a positive DC voltage is applied across lines 82 and 81 that are supplied to output connection 30. In this manner, a low voltage signal applied to input connection 82 causes relay CR1 to interconnect power receptacles 50 with the source of high voltage power connected with power cable 44 and causes a low voltage command signal to be produced at low voltage output connector 30. Thus, another power strip 42, whose low voltage input 22 is connected with low voltage output 30 of the particular power strip, will have its power receptacles 50 energized in a similar fashion. The low voltage command signal supplied to low voltage output connection 30 is derived from low voltage power supply 77, which is powered from the high voltage source 15 through cable 44 of the associated power strip 42. Thus, the load placed on the source of the low voltage command signal presented to input connection 22 is the same whether an additional power strip 42 is connected with output connector 30 or not. Therefore, additional power strips 42 may be combined in power distribution system 10 without providing additional load on the source of the low voltage input command signal. In this manner, a theoretically unlimited number of power strips 42 may be connected in power distribution system 10 without requiring a corresponding increase in the current supply capabilities from touch control module 34.

Optical coupler U2 provides isolation between low voltage input 22 and switching circuit 60. The connection of lines 80 and 81 to low voltage input 22 provides a source of supply voltage for touch control module 34. In this manner, touch control module 34 does not require a separate power supply, nor a separate cable to supply its power requirements. When a low voltage output connector 30 is used as the source of the command signal for low voltage input 22, no connection is made to the voltage supply lines 80 and 81 of the next power strip.

In the illustrated embodiment, the low voltage command signal provided to the low voltage input 22 of the first power strip 42 is produced by touch-responsive circuit 38 (FIGS. 7a and 7b) Touch control module 34, including touch panel 36 and touch-responsive circuit 38 are disclosed in detail in commonly-owned, copending application Ser. No. 07/535,111 filed concurrently herewith, for a TOUCH SENSITIVE CONTROL CIRCUIT by David Caldwell et al, the disclosure of which is hereby incorporated herein by reference. The details of such touch control module will not be repeated herein. Suffice it to say that touch panel 36 includes a first conductive touch pad 90 mounted to a substrate, such as glass panel 92, for receiving a user "ON" selection to energize power receptacles 50. A second conductive touch pad 94 on substrate 92 receives a user "OFF" selection to deenergize receptacles 50. The capacity of a user contacting touch pad 90 or 94 is detected by conductive pads 95 through 98 mounted via a mylar carrier 99 to substrate 92 opposite touch pads 90 and 94. Pads 95 through 98 and a ground plane are connected by a connector 100 to a connector 102 of touch responsive circuit 38. Circuit 38 includes an output latch 104 whose output 106 is connected through a diode 107 to the base 108 of a transistor Q1. Base 108 is connected through a pull-up resistor 109 to the positive supply voltage rail 112. The emitter of transistor Q1 is grounded and its collector 110 is connected to line 88 (FIG. 4). Line 86 (FIG. 4) is connected through line 116 and resistor 114 to voltage rail 112.

If the user contacts "OFF" touch pad 90, latch circuit 104 produces a steady low output 106, which clamps base 108 of transistor Q1 low and prevents Q1 from conducting. With Q1 nonconducting, no current is supplied to diode 84 of U1 (FIG. 4) and coil 62 of relay CR1 is deenergized. When the user contacts "ON" touch pad 94, latch 104 changes state and its output 106 has a positive voltage, which allows resistor 109 to provide a drive current to base 108 of transistor Q1. This drives Q1 into conducting, which provides a voltage across lines 86 and 88 to supply a current to diode 84.

In the illustrated embodiment, the voltage across lines 80 and 81 change from approximately 24 volts to 12 volts when relay CR1 becomes energized because power supply 77 is substantially unregulated. However, touch-responsive circuit 38 is ratiometric, in that it is capable of satisfactory performance notwithstanding the drastic swing in its supply voltage. This provides a significant cost savings to power distribution system 10 because it eliminates a voltage regulator from each power strip 42. Although the voltage across lines 80 and 81 change significantly, depending upon the state of relay CR1, a zener diode D1 across coil 62 prevents a momentary application of 24 volts across coil 62 during the interval between transistors 79 beginning to conduct and the voltage across lines 80 and 81 dropping as a result thereof. Diode D1 additionally provides reverse voltage spike protection to coil 62.

Because conventional telephone jacks are used for low voltage input and output connections 22 and 30, switching circuit 60 is configured to reduce the risk of damage to a telephone or telephone hand-set, or to circuit 60 per se, if a user inadvertently connects a telephone hand-set to jack 54 or connects a telephone line to jack 53. If a telephone line is connected to jack 53, approximately 100 volts ringing signal could be applied across lines 86 and 88. Resistor 89, which in the illustrated embodiment, is 1.0K ohms, limits the current that is developed to avoid damage to network U2 under such circumstances. If a telephone hand-set is connected to jack 54, the low voltage output command signal on lines 81 and 82 would be applied to the speaker of the telephone hand-set. The impedance of the speaker would be sufficient to limit the resulting current to relatively harmless levels.

Figure 5:
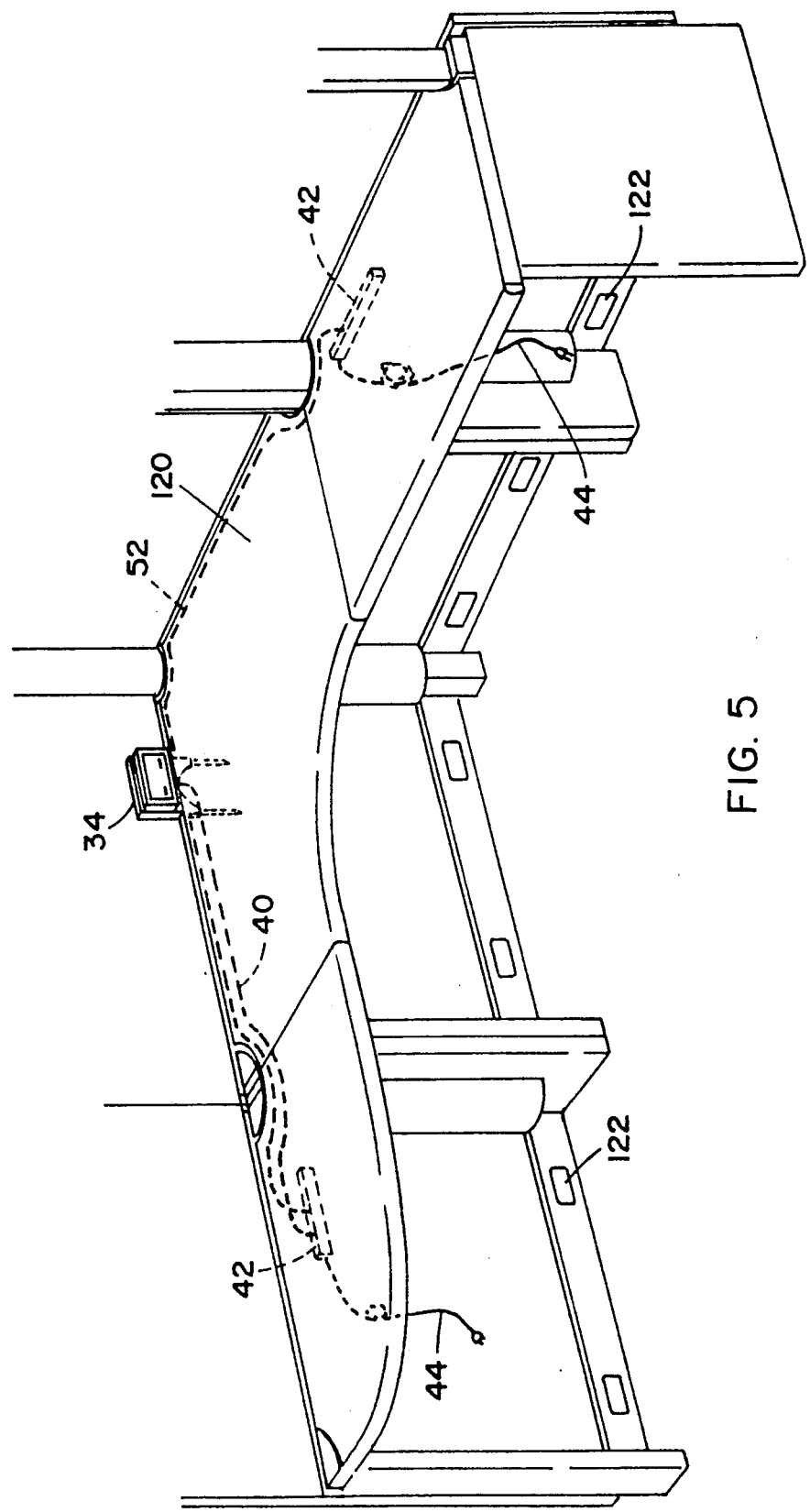
FIG. 5 is a perspective view of an office work station showing a power distribution system being assembled thereto.
Figure 6:
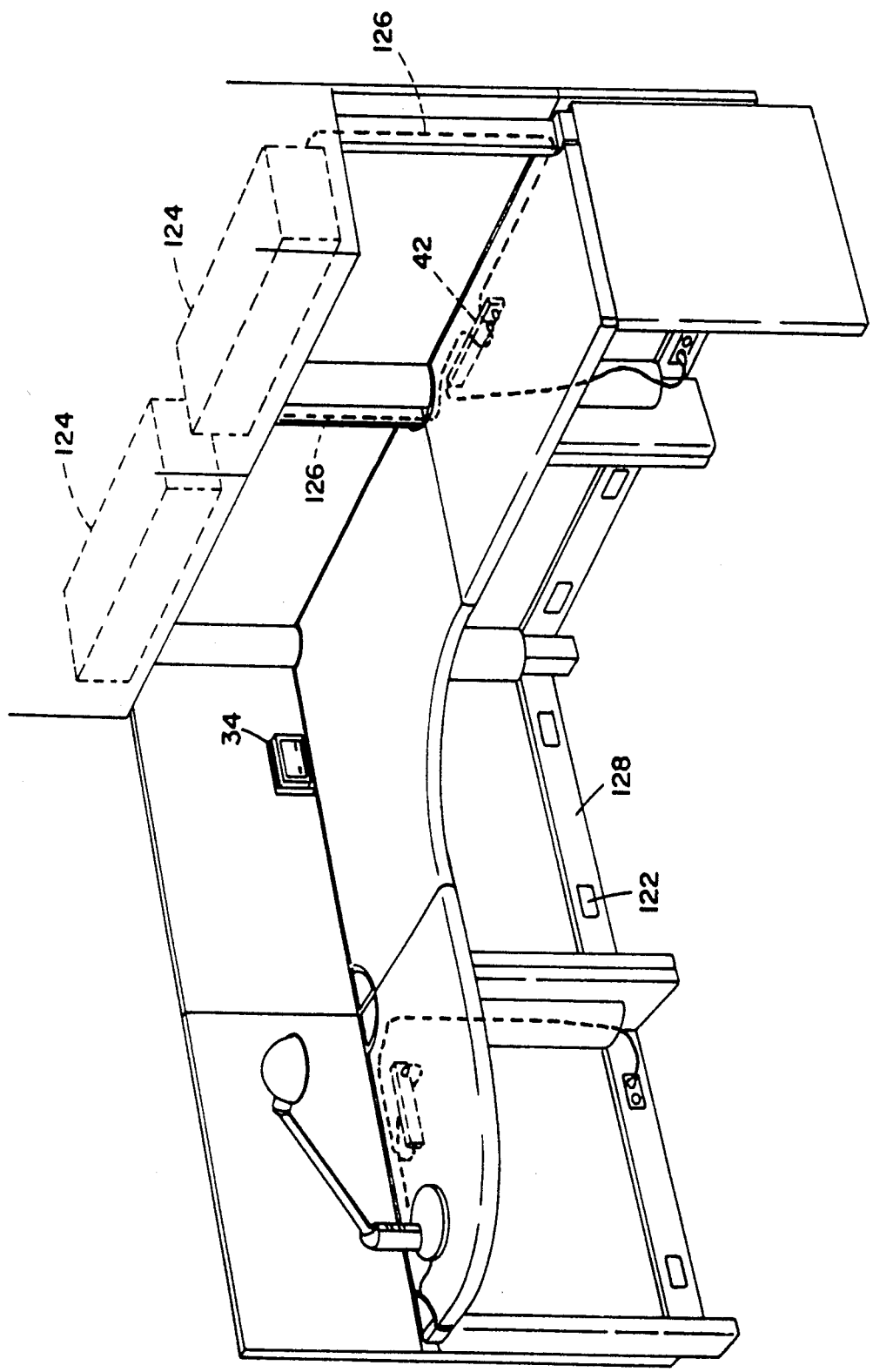
FIG. 6 is the same view as FIG. 5 with a fully assembled embodiment of a power distribution system.

Installation of power system 10 in a work station is illustrated in FIGS. 5 and 6. As many power strips 42 as desired are assembled under a work surface 120 and touch control module 34 is positioned above work surface 120 in openings (not shown) provided for such mounting purpose. Low voltage cable 40 is extended from touch head 34 to the first power strip 42 and low voltage cable 52 is extended between power strips 42 in the manner previously set forth. Power cables 44 are plugged into continuously-powered receptacles 122 supplied from the building power grid. Power distribution system 10 is now fully set up and any appliances, such as computers, calculators, lights, or the like, plugged into receptacles 50 will be commonly energized and deenergized from touch control module 34.

Although a task lighting device 124 is shown in FIG. 6 as having a power cord 126 plugged into one receptacle 50 of power strip 42, an alternative configuration would be to provide switching circuit 60 internal to task lighting device 124 and to directly control application of high voltage electrical power to task lighting device 124 by a low voltage cable 52 connected therewith. In such a configuration, power cord 126 of lighting device 124 would be plugged directly into continuously-powered receptacles 122. As a further alternative, rather than providing power strips 42 as externally mounted temporary power taps, a switching circuit 60 could be built into power raceway 128 such that receptacles 122 would be directly switchable from touch control module 34. Other variations would suggest themselves to those skilled in the art.

Figure 9:
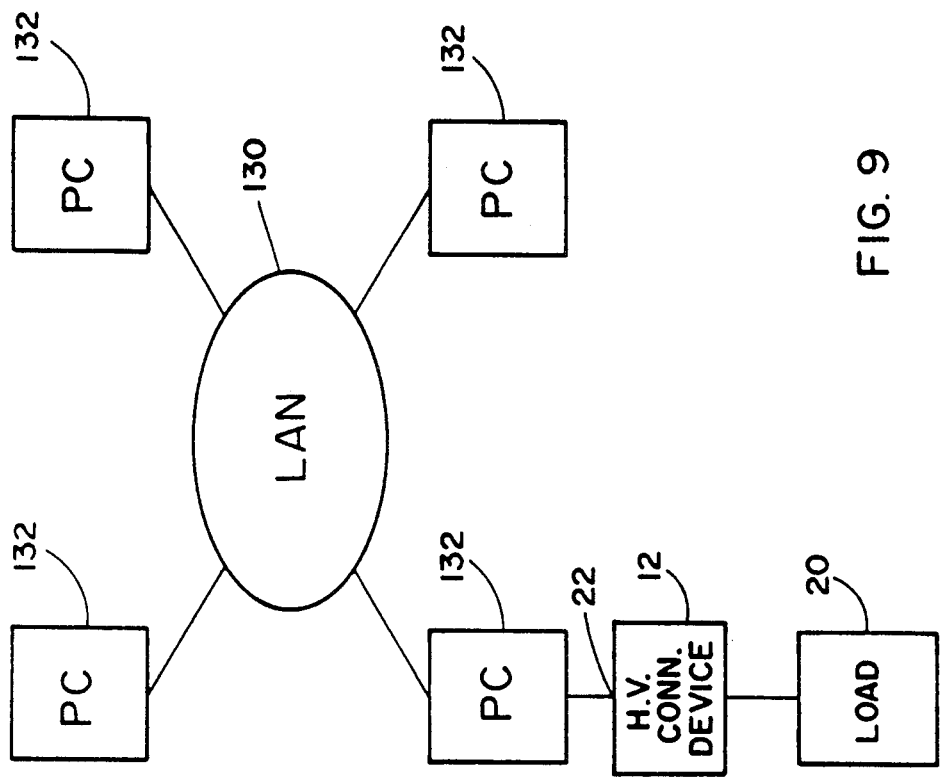
FIG. 9 illustrates another embodiment of the invention.

Although the invention is illustrated receiving a low voltage command signal from touch control module 34, other sources of the command signal are possible. In FIG. 9, a local area network, or LAN, 130 includes a plurality of computers 132 in a network configuration. Because the low voltage input 22 to high voltage connection device 12 is compatible with TTL logic, connection device 12 is capable of being energized and deenergized directly from outputs of one of the computers 132. This allows for the automatic power-up and power-down of various portions of an office in response to the programming of computer 132, as well as other variations that will be readily apparent. Other input devices 14 include motion detectors as well as infrared, ultraviolet and thermal-gradient detectors for use in building security. Electronic clock devices and common mechanical rocker switches are also suitable input devices By utilizing a keypad and security software, actuation of load 20 could be limited to particular individuals possessing appropriate security codes. If a computer is the load 20, rather than an input device, a keypad would provide security capabilities to power distribution system 10 to limit access to the computer Because the power distribution system disclosed herein is operated with a switchable, constant DC voltage, it is extremely insensitive to electromagnetic interference. Because the system boundaries are established by hard-wire connection, there is virtually no risk of inadvertent interference from adjacent systems. Power distribution system 10 is relatively inexpensive and may be set up with minimal wiring interconnections. The power distribution system disclosed herein may be adapted to virtually any application in which it is desirable to control the energization and deenergization of a load.

Although switch circuit 60 is illustrated using an electromechanical relay, solid state devices may be used in certain applications. Additionally, it may be advantageous to use normally-closed rather than normally-open relay contacts to allow plug strip 42 to operate as a conventional plug strip by eliminating a connection with an input device. Other changes and modifications in the specifically described embodiments can be carried out without departing from the principles of the invention, which is intended to be limited only by the scope of the appended claims, as interpreted according to the principles of patent law including the doctrine of equivalents.

The power distribution system in claim 20 in which said circuit includes means for preventing damage to said circuit from a telephone component connected with one of said first and second low voltage connectors.

The embodiments of the invention in which an exclusive property or privilege is claimed are defined as follows:

1. A user operable power distribution system that is adapted to being expanded to accommodate additional loads comprising:
   a connection device including a switch circuit for selectively connecting a load with a source of supply voltage;
   said switch circuit including a low voltage input and a low voltage output;
   said switch circuit being responsive to a low voltage input command signal to connect said load with said source of supply voltage;
   said switch circuit being responsive to a low voltage input command signal to provide a low voltage output command signal on said low voltage output; and
   a user command device connected with said low voltage input for selectively supplying said low voltage input command signal.

2. The power distribution system in claim 1 wherein said low voltage output command signal is derived from said supply voltage.

3. The power distribution system in claim 2 including isolation circuitry between said low voltage input and said switch circuit.

4. The power distribution system in claim 1 wherein said user command device is a touch control module that is responsive to contact by a user in order to allow a user to selectively supply said input command signal.

5. The power distribution system in claim 4 in which said low voltage input includes a supply of power to said user command device.

6. The power distribution system in claim 1 including another connector device having another switch circuit for connecting another load with a source of supply voltage, said another switch circuit including another low voltage input connected with said low voltage output of said connection device, said another switch circuit being responsive to a low voltage input command signal on said another low voltage input to connect said another load with said supply voltage.

7. The power distribution system in claim 6 in which said switch circuit includes another low voltage output and is responsive to a low voltage input command signal on said another low voltage input to produce a low voltage output command signal on said another low voltage output.

8. A user operable power distribution system that is adapted to being expanded to accommodate additional loads comprising:
   at least one high voltage connection device including a high voltage switch circuit for selectively connecting a high voltage load with a source of high voltage power and a low voltage control circuit powered from said source of high voltage power for selectively operating said high voltage switch circuit;
   said low voltage control circuit including a low voltage input and a low voltage output;
   said low voltage control circuit being responsive to a low voltage input command signal to operate said high voltage switch circuit in order to connect said high voltage load with said source of high voltage power;
   said low voltage control circuit being responsive to a low voltage input command signal to produce a low voltage output command signal on said low voltage output; and
   a user command device connected with said low voltage input to allow a user to selectively supply said low voltage input command signal.

9. The power distribution system in claim 8 wherein said low voltage output command signal is generated by said low voltage control circuit.

10. The power distribution system in claim 9 including isolation circuitry between said low voltage input and said low voltage control circuit.

11. The power distribution system in claim 8 wherein said user command device is a touch control module that is responsive to contact by a user in order to allow a user to selectively supply said command signal.

12. The power distribution system in claim 11 in which said connection device includes a low voltage power supply for supplying low voltage power to said low voltage control circuit and to said user command device.

13. The power distribution system in claim 12 in which said low voltage power supply is substantially unregulated.

14. The power distribution system in claim 8 including another high voltage connection device having another high voltage switch circuit for connecting another high voltage load with a source of high voltage power and another low voltage control circuit powered from said source of high voltage power for selectively operating said another high voltage switch circuit, said another low voltage control circuit including another low voltage input connected with said low voltage output of said at least one high voltage connection device, said another low voltage control circuit being responsive to a low voltage input command signal to operate said another high voltage switch circuit in order to connect said another high voltage load with said source of high voltage power.

15. The power distribution system in claim 14 in which said another low voltage control circuit includes another low voltage output and wherein said another low voltage control circuit is responsive to a low voltage input command signal to generate a low voltage command signal on said another low voltage output.

16. The power distribution system in claim 8 in which said high voltage load includes a power receptacle for supplying high voltage power to a load.

17. The power distribution system in claim 16 in which said high voltage load includes a plurality of said power receptacles electrically connected in parallel.

18. The power distribution system in claim 8 in which said high voltage load is a task lighting device.

19. A user-contact operable power distribution system that is adapted to being expanded to accommodate additional loads comprising:

at least one high voltage connection device including a housing, a circuit in said housing, first connecting means for connecting said circuit to a source of high voltage, second connecting means connected with said circuit and third connecting means connected with said circuit, said circuit including switching means responsive to a low voltage input command signal on said second connecting means for selectively connecting a load with said first connecting means and for producing a low voltage output command signal on said third connecting means;

said second connecting means including a first low voltage connector mounted to said housing;

a touch control module adapted to selectively supplying said low voltage input command signal and having a low voltage input command signal line including a second low voltage connector connected with said first low voltage connector; and said third connecting means including a third low voltage connector mounted to said housing and being different from said first and second low voltage connectors so that said second low voltage connector cannot be connected to said third low voltage connector.

20. The power distribution system in claim 19 in which one of said first and second low voltage connectors is a telephone-in type connector and the other one of said first and second low voltage connectors is a telephone hand-set type connector.

21. The power distribution system in claim 20 in which said circuit includes means for preventing damage to a telephone component connected with one of said first and second low voltage connectors.

22. The power distribution system in claim 20 in which said circuit includes means for preventing damage to said circuit from a telephone component connected with one of said first and second low voltage connectors.

* * * * *